United States Patent
Ramaswamy et al.

(10) Patent No.: US 6,367,412 B1
(45) Date of Patent: Apr. 9, 2002

(54) POROUS CERAMIC LINER FOR A PLASMA SOURCE

(75) Inventors: Kartik Ramaswamy, Santa Clara; Kwok Manus Wong, San Jose; Ashish Bhatnagar, Sunnyvale; Mehran Moalem; Tony S. Kaushal, both of Cupertino; Shamouil Shamouilian, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/506,111

(22) Filed: Feb. 17, 2000

(51) Int. Cl.$^7$ .................... C23C 16/00; H05H 1/00; B01D 46/00
(52) U.S. Cl. .................. 118/723 I; 118/723 ME; 118/723 ER; 156/345; 55/286
(58) Field of Search .................. 118/723 I, 723 ER, 118/723 ME, 723 IR, 723 DC, 723 MR, 715; 156/345; 55/286

(56) References Cited

U.S. PATENT DOCUMENTS

| | | | | |
|---|---|---|---|---|
| 3,987,755 A | * | 10/1976 | Linn | .................. 118/417 |
| 5,269,848 A | * | 12/1993 | Nakagawa | .......... 118/723 ME |
| 5,683,548 A | * | 11/1997 | Hartig et al. | ................ 438/729 |
| 6,093,461 A | * | 7/2000 | Yamaguchi et al. | ....... 428/34.4 |
| 6,187,072 B1 | * | 2/2001 | Cheung et al. | ................ 55/186 |

FOREIGN PATENT DOCUMENTS

| | | | | |
|---|---|---|---|---|
| GB | 1490543 | * | 11/1977 | ........... C01B/33/00 |

* cited by examiner

Primary Examiner—Gregory Mills
Assistant Examiner—P. Hassanzadeh
(74) Attorney, Agent, or Firm—Charles S. Guenzer; Joseph Bach

(57) ABSTRACT

A plasma tube comprising a vacuum sealing ceramic outer tube, a porous ceramic insert disposed on the inside wall of the outer tube, and a source of high frequency radiation, for example, an RF coil wrapped around the tube, to excite gas flowing through the bore of the insert into a plasma. The invention is particularly useful as an exhaust scrubber for oxidizing exhaust gases from a semiconductor processing chamber. A catalyst may be embedded in the porous insert to promote the scrubbing reaction. The invention may also be used in an applicator of a remote plasma source.

20 Claims, 1 Drawing Sheet

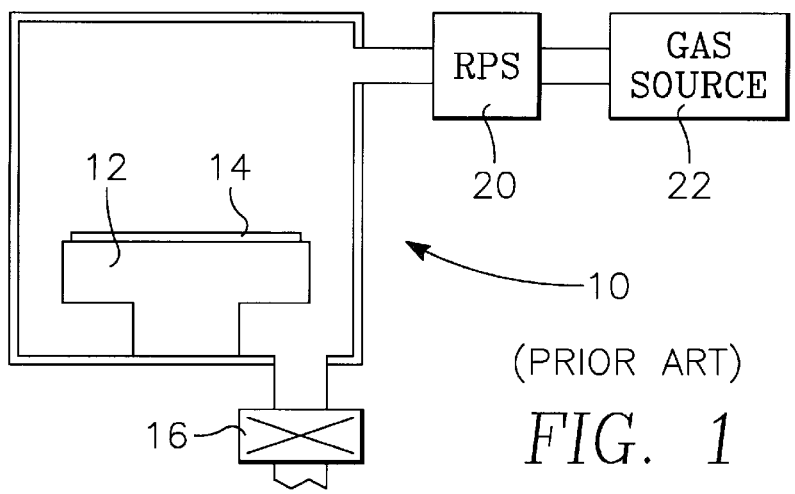
(PRIOR ART)
FIG. 1
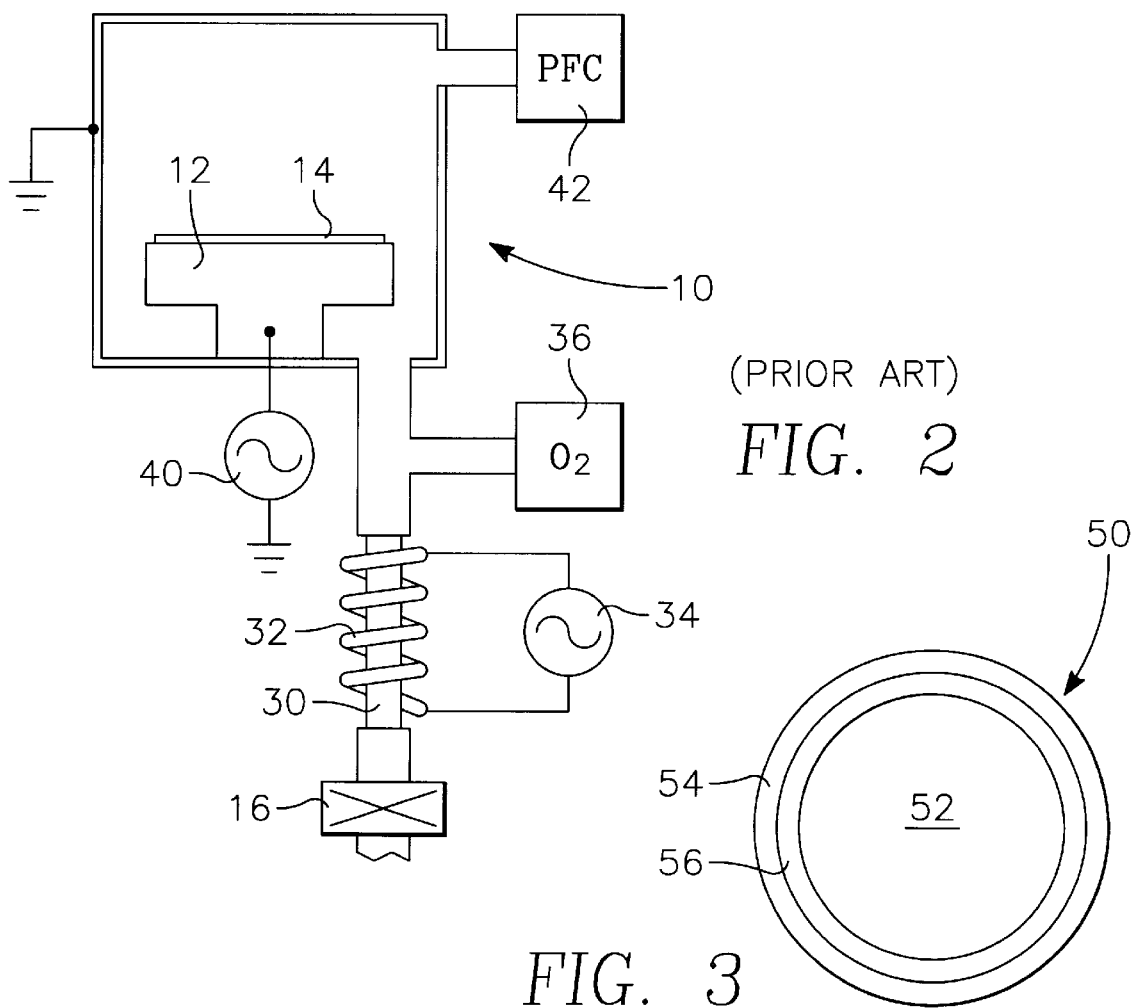
(PRIOR ART)
FIG. 2
FIG. 3

POROUS CERAMIC LINER FOR A PLASMA SOURCE

FIELD OF THE INVENTION

The invention relates generally to plasma sources. In particular, the invention relates to liners used in inductively or microwave powered plasma sources.

BACKGROUND ART

Plasma processing is widely used in many applications in the field of fabrication of semiconductor integrated circuit. In the most common and long standing class of application, one or more wafers are inserted in a plasma reactor, and a processing gas is injected into the reactor and is excited into a plasma by coupling electrical energy into the plasma reactor. In etching applications, the processing gas typically includes a halogen-based gas, and typically RF power is applied to the pedestal electrode supporting the wafer to excite the gas into a plasma. In applications involving chemical vapor deposition, the processing gas includes chemical precursors of the material to be deposited, and typically RF power is applied to a showerhead electrode in opposition to the wafer being coated. The RF plasma activates the chemical reaction converting the precursor gas into the material coated on the wafer. In sputtering applications, typically negative DC power is applied to a target electrode comprising the material to be sputter deposited on the wafer. A working gas, such as argon, is excited into a plasma, and the positive argon ions are attracted to the negatively biased target to sputter the target material, which is then deposited on the wafer. Recently, there has been much interest in high-density plasma (HDP) reactors additionally including an RF inductive coil positioned adjacent to the plasma reactor to couple RF energy into a plasma source region.

Aside from these standard applications, plasmas have also been used for auxiliary purposes in semiconductor processing chambers. Plasmas are used to dry clean surfaces of the chamber without the need to open the chamber for operator access or even to vent the chamber to atmospheric pressure. Plasmas have also been used to clean or precondition wafer surfaces before the more standard types of processing, whether by plasma or by thermal activation.

Most typically, the plasma is generated in the processing chamber containing the substrate being processed. However, for some processes, the gas is excited into a plasma in a remote location and then transported in its excited state to the processing chamber. One such configuration is illustrated schematically in FIG. 1. A processing reactor 10 includes a pedestal 12 for supporting a wafer 14 to be processed. A vacuum pumping system 16 connected to the reactor 10 maintains the reactor at the relatively lower pressures associated with semiconductor processing, particularly plasma processing. These pressures are typically in the range of about 1 milliTorr to a few hundred Torr. The details of the reactor 10 are not illustrated, and the reactor may be configured for etching, CVD, sputtering, or possibly other processes. Particularly for CVD, the deposition may be performed by a thermal process while auxiliary functions may be performed by a plasma process.

A remote plasma source (RPS) 20 is connected to the reactor 10 but is distinctly separate from it. The RPS 20 receives gas from a gas source 22, excites it into a plasma, and delivers the plasma-excited gas to the reactor 10. A plasma usually contains some combination of ions and radicals of the excited gas. For example, a hydrogen plasma created from $H_2$ gas may contain positively charged $H^+$ ions and neutral H* radicals. Usually, the path between the remote plasma source 20 and the reactor 10 is long enough that the ions recombine before reaching the reactor and a mostly neutral stream of radicals is delivered to either process the wafer 14 or to clean the wafer 14 or the reactor chamber 10. However, there are applications, such as metal etching, in which a remote plasma source excites the processing gas into a plasma for etching or other direct processing of the wafer without the use of a plasma source within the reactor chamber.

Remote plasma sources usually rely on a large amount of microwave or RF energy applied to a dielectric tube carrying the gas. This configuration is referred to as an applicator. The large amounts of applied power, its application in sequences lasting on the order of minutes or less, and the corrosive nature of even argon plasmas have imposed severe design constraints on the applicator.

A similar set of problems has arisen in a structurally similar application of abatement plasma chambers. Semiconductor processing often involves noxious processing gases or noxious gaseous byproducts. In the past, the standard procedure has relied upon tall smokestacks to vent the gaseous exhaust from semiconductor processing reactors to a height sufficient that the noxious exhaust presents little risk of harm at ground level. Many people will no longer accept such a solution, and such exhausts are regulated by state and federal regulations. Chlorofluorocarbons (CFCs) have been shown to deplete the ozone layer on a world-wide scale. An international treaty has attempted to reduce if not virtually eliminate the emission of CFCs into the atmosphere. Furthermore, environmental and local political groups have shown an increasing intolerance for any emission of noxious material into the atmosphere regardless of the level of risk associated with such emission.

For these reasons, clean semiconductor processing systems are greatly desired. The use of CFC precursors has in large part been eliminated. Nonetheless, the complex plasma chemistry may result in a large number of materials in the exhaust, and the variety and uncertainty have made it difficult to assure that there is no noxious material in the reactor exhaust. Therefore, one favored approach scrubs the exhaust to somehow remove or deactivate those chemicals considered to be dangerous. One generic approach is to plasma treat the exhaust from the chamber to assure that the contents of the exhaust are in a benign form. For example, they have been thoroughly oxidized. With few exceptions, oxides of almost all materials used in semiconductor processing are not considered to be particularly dangerous.

Such a plasma abatement system is schematically illustrated in FIG. 2. It includes a dielectric plasma tube 30 positioned between the processing chamber 10 and the final stage of the vacuum pumping system 16. Additional pumping elements may be positioned upstream of the plasma tube 30, but the pressure within the tube 30 must be low enough to allow a plasma to be excited from the exhaust gas. An RF coil 32 is wrapped around the plasma tube and is powered from an RF source 34 to couple sufficient electrical energy into the plasma tube 30 to excite the gas within it into a plasma. A oxygen source 36 is positioned upstream of the plasma tube 32 to inject oxygen into the exhaust stream so that the plasma within the plasma tube contains not only the exhaust but also sufficient oxygen to oxidize substantially all of the oxidizable components of the exhaust whatever their source and composition. The figures fail to illustrate the valves and mass flow controllers associated with the gas sources 22, 36, 42.

To provide some specificity to the example, the reactor is assumed to be a capacitively coupled oxide etch reactor in which the pedestal electrode 12 is selectively powered from an RF power source 40 to excite a perfluorocarbon etching gas supplied from a source 42 into an etching plasma. Examples of perfluorocarbons are $CF_4$, $C_2F_6$, $C_3F_8$, $C_4F_8$, and $C_4F_6$. Typically, an argon diluent gas is also supplied, but argon is a chemically inactive gas considered to be harmless in the small amounts associated with plasma processing and will not be further discussed. Although the perfluorocarbon is excited into a plasma to chemically react with the oxide being etched and to a lesser extent with the chamber parts and other parts of the integrated circuit structure, a substantial fraction of unreacted perfluorocarbon gas is exhausted from the etch chamber. Perfluorocarbons are not greatly toxic or poisonous, but they are considered to be harmful and corrosive. The purpose of the abatement plasma chamber is to oxidize PFCs into $CO_2$ and $COF_2$, both of which are gases considered to be relatively benign and not needing further cleaning or controlled disposal.

In the past, plasma tubes, as well as applicators, have typically been cylindrically shaped and composed of alumina ceramic. The ceramic tube must provide two functions. It operates as a vacuum wall for maintaining the tube interior at sufficiently low pressure for supporting a plasma. Its vacuum sealing capability is generally sufficient for a commercially sized vacuum pump to be able to maintain a vacuum down to at least 1 Torr. The ceramic tube must also act as dielectric window for passing microwave power (in the case of some applicators) or RF inductive power from an externally placed inductive coil into the tube interior. The electrical resistance of the tube wall must be high enough at the electromagnetic frequencies being used that the wall passes pass substantially all the radiation and absorbs very little power, certainly less than 10% of the incident power. These ceramic tubes typically have had diameters of about 2 inches (5 cm) and wall thicknesses of between 1/16" to 1/8" (1.5 to 3 mm). A sufficient plasma density is achieved when the abatement plasma chamber is supplied with greater than 1 kW of RF power, typically in the frequency range of 2 to 13.56 MHz.

Such a design, however, has presented some difficulties. The nature of a high-power RF inductive coil is that a substantial DC voltage develops across it from one end to the other because of the resistive loss of the coil material. It is not uncommon for 1000 V of DC voltage to develop on the coil adjacent to the plasma tube. Such voltages will cause ions in the plasma to be accelerated to the inside of the plasma tube. The ion energy is dissipated as heat in the tube, greatly heating it, and some localized sputtering of the tube interior is inevitable at such high energies. Furthermore, ceramics tend to be poor thermal conductors and to be relatively fragile. The sudden application of RF power to the plasma tube creates thermal shock in the tube. The shock is intensified because the heating is localized to the area of the RF coil, and the heat only slowly diffuses to unheated areas. It is believed that these mechanisms are the source of cracking observed in the portions of the alumina tube directly underlying the coil wraps.

It is of course desirable to reduce if not eliminate the problems associated with high levels of RF power coupled through ceramic tubes, particularly for abatement plasma chambers.

Another concern with abatement plasma chambers is that the exhaust gas may contain a large number of chemical species. It is greatly desired that the oxidation of these materials be as complete and universal as possible, regardless of the pollutant composition.

SUMMARY OF THE INVENTION

The invention may be summarized as an inductively coupled plasma tube, particularly one used in a abatement plasma system, in which a porous ceramic insert is included on the inside of the ceramic tube forming both a dielectric window and a vacuum wall.

In another aspect of the invention useful in plasma abatement systems, a catalyst such as platinum or nickel is embedded in the porous ceramic.

BRIEF DESCRIPTION OF THE DRAWINGS

FIG. 1 is a schematic illustration of a remote plasma source of the prior art usable in a semiconductor processing system.

FIG. 2 is a schematic illustration of plasma abatement chamber of the prior art usable in a semiconductor processing system.

FIG. 3 is an axial cross-sectional view of a plasma tube of the invention including a porous ceramic insert.

DETAILED DESCRIPTION OF THE PREFERRED EMBODIMENTS

A first embodiment of the invention is a cylindrical plasma tube 50, illustrated in the axial cross-sectional view of FIG. 3, which may be used as the plasma tube 30 of the plasma abatement system of FIG. 2 or as part of a remote plasma source 20 in FIG. 1. In use as an inductive plasma source, an unillustrated inductive coil is wrapped around the exterior of the tube wall to excite into a plasma the gas flowing axially through an interior bore 52 of the tube 50. The plasma tube 50 includes a conventional outer ceramic tube 54, such as those previously described in FIGS. 1 and 2, which acts both as a vacuum wall and as a dielectric window. A tubular porous ceramic insert 56 is placed inside of the outer ceramic tube 54. Preferably, the ceramic insert 56 is loosely fit in the outer ceramic tube 54 and may be held therein by fixtures at both ends of the two tubes 54, 56.

The composition of the ceramic insert 56 may be similarly chosen to that of the outer ceramic tube so as to present low dielectric loss and low chemical reactivity with the plasma. However, its quality in a non-porous state as a vacuum wall is not important. It may be formed of alumina ($Al_2O_3$), aluminum nitride (AlN), calcium fluoride ($CaF_2$), silicon carbide (SiC), or boron nitride (BN), among other materials. Aluminum nitride has the especial advantage of a high thermal conductivity. For fluorine-based etching applications, quartz ($SiO_2$) should not be used because it too will be etched by a fluorine plasma. The outer ceramic tube 54 and the ceramic insert 56 may be composed of the same material or of different materials.

According to the invention, the ceramic insert 56 is porous, having a porosity in the range of 30 to 80%, preferably in the range of 50 to 60%. Porosity may be measured for most commercially available materials by determining the ratio of the weight density of the porous material to a dense, vacuum sealing version of the same material composition. An exemplary tubular wall thickness for the insert 56 is 1/4 inch (6.5 mm)

Porous alumina tubes may be formed by mixing small polyurethane balls into the slurry used in sintering alumina. During the baking used in thermal sintering, the polyurethane balls decompose into volatile products, which are exhausted from the system, leaving interlinked interstices in a porous structure. Porous ceramic inserts are commercially available. For example, the Selee Corporation of Hendersonville, N.C. supplies ceramic foam filters for the metals industry.

The porosity of the liner offers several advantages. The pores are too small to support a plasma (their diameters are less than a plasma dark space length at the relevant pressure) so the plasma is restricted to the interior of the porous tubular insert. Thereby, sputtering and localized heating is reduced. The porous material is more flexible than the dense material so cracking is less of a problem. Although a porous material is usually avoided inside a vacuum chamber because it takes so long to pump down, abatement plasma chambers tend to operate at somewhat higher pressures and the impurities being slowly released from the pores do not significantly affect the abatement system. Indeed, the extra pressure in the pores promotes convective heat transfer through the insert material.

Most ceramics have sufficiently high resistivity in the megahertz frequency range to satisfy the requirement that the outer ceramic tube and the insert provide low dielectric loss, that is, less than 5% power absorption of the RF power for each of them, and preferably less than 1%. The outer ceramic tube itself or with the application of a outer lining must be vacuum sealing, which may be defined as any leakage through the walls imposing no more than 5% load on the pumping system 16, and preferably less than 1%, when used in conjunction with conventional semiconductor chambers 10 and process recipes. Vacuum-tight, dielectric ceramic tubes are well known and widely used.

Other embodiments of the invention are possible. A porous ceramic base tube, similar to that of the porous insert, may be obtained. Then, a dense and impervious ceramic layer may be coated on the exterior of the base tube, for example, by chemical vapor deposition or plasma spraying. For example, porous dielectric silicon carbide can be sintered into tubular forms, and then dense silicon carbide may be coated onto the exterior of the porous tube by CVD or plasma spraying to form an exterior dielectric vacuum wall. Lu et al. in U.S. patent application Ser. No. 08/687,740 have disclosed the usefulness of SiC composite structures in plasma reactors, but not in regard to porosity.

Further, a catalyst additive such as platinum or nickel, may be included within the porous tube. Such catalytic materials seem effective in catalyzing and thus increasing the yield of almost any chemical reaction. The atoms of the catalytic materials should not be incorporated into the ceramic crystal structure, but usually in such composites the metal phase remains intact though of a size much smaller than the pore size. Porous matrices for catalyst have the additional advantage of having an extremely large effective surface area. Because catalysis is primarily a surface effect, the increased surface area increases the catalyzed reaction rate. It is noted that even though a plasma is not supported within the pores, the plasma species, particularly the radicals, once they have been produced, can still diffuse into the pores.

The catalyst can be embedded into the porous matrix in a number of ways. The catalyst may be included in the tube being sintered or otherwise cast, but the casting process must assure that the metal phase segregates and that the atoms do not become individually incorporated into the ceramic lattice structure. The catalyst may be implanted into the porous ceramic. The catalyst may be deposited as a very thin film by chemical vapor deposition or liquid phase deposition. Although platinum metal and nickel metal are the most common catalytic materials, other catalytic compositions are known.

Although the invention has been described mostly in regards to plasma tubes used in abatement plasma systems, the invention is not so limited. RPS applicators are one apparent use. It is also possible to extend the use of porous ceramic liners to curved plasma reactors dielectric domes, such as those described by Lu in the above cited patents, in which an inductive coil is wrapped outside of the dome to couple RF energy into the plasma source region. The area of the domes adjacent the coils has often been prone to erosion, because of the high power density there. Accordingly, an annular insert conforming to the inside shape of the dome may be placed in those portions of the dome next to the RF coil.

The invention may also be applied to microwave plasma sources, in which the RF coil is replaced by a microwave transmission liner terminating in or passing through plasma tube.

The invention thus provides a simple, cost-effective method of protecting a dielectric window of a plasma reaction chamber.

What is claimed is:

1. A plasma tube, comprising:
    a vacuum sealing ceramic outer tube;
    a porous ceramic inner tube formed from a material that is porous throughout and disposed and slidably fitted within said outer tube through a center bore of which a gas passes; and
    an RF inductive coil wrapped around said outer tube to couple RF energy into said center bore to excite said gas into a plasma.

2. The plasma tube of claim 1, wherein said inner tube has a porosity of between 30 and 80%.

3. The plasma tube of claim 2, wherein said porosity is between 50 and 60%.

4. The plasma tube of claim 1, wherein said inner tube is doped with a catalyst for promoting reactions of said gas.

5. The plasma tube of claim 4, wherein said catalyst is selected from the group consisting of nickel and platinum.

6. The plasma tube of claim 1, wherein each of said inner and outer tube comprises a respective ceramic selected from the group consisting of alumina, aluminum nitride, calcium fluoride, silicon carbide, and boron nitride.

7. A plasma tube, comprising:
    a vacuum sealing ceramic outer tube;
    a porous ceramic inner tube having a porosity of between 30 and 80% and disposed within said outer tube through a center bore of which a gas passes, wherein said outer tube is coated onto said inner tube; and
    an RF inductive coil wrapped around said outer tube to couple RF energy into said center bore to excite said gas into a plasma.

8. The plasma tube of claim 7, wherein said inner tube is doped with a catalyst for promoting reactions of said gas.

9. A plasma tube, comprising:
    a first dielectric, vacuum sealing tube;
    a second dielectric tube disposed inside said first tube having a porosity of between 30 and 80% and including a central bore; and
    electromagnetic means positioned on a side of said first tube capable of exciting a gas contained in said central bore into a plasma.

10. The plasma tube of claim 9, wherein said electromagnetic means comprise an inductive coil wrapped around said first tube.

11. The plasma tube of claim 9, wherein said electromagnetic means comprises a microwave cavity directed at said side of said first tube.

12. The plasma tube of claim 9, wherein said each of said first and second tubes comprises a respective ceramic selected from the group consisting of alumina, aluminum nitride, calcium fluoride, silicon carbide, and boron nitride.

13. The plasma tube of claim 9, wherein said second tube comprises a catalytic material.

14. The plasma tube of claim 13, wherein said catalytic material is selected from the group consisting of nickel and platinum.

15. The plasma tube of claim 9, wherein said second dielectric tube is slidably fitted within said first dielectric tube.

16. A self-cleaning semiconductor processing system, comprising:

a vacuum chamber capable of holding therein a substrate to be processed in a processing gas supplied to said chamber;

a vacuum pumping system removing said processing gas and gaseous products of said processing gas from said vacuum chamber through a pumping port;

an abatement plasma system and said vacuum pumping system and comprising a vacuum sealing outer ceramic tube, a porous inner ceramic tube having a porosity of between 30 and 80% and disposed inside of said outer tube and having an inner bore connected in a pumping path between said pumping port and a downstream pump of said vacuum pumping system, and an inductive coil wrapped around said outer tube and connectable to a source of RF power.

17. The processing system of claim 16, further comprising a source of oxidizing gas connected to said pumping path between said pumping port and said abatement plasma system.

18. The processing system of claim 16, wherein said inner ceramic tube includes a catalyst embedded therein.

19. The processing system of claim 18, wherein said catalyst is selected from the group consisting of nickel and platinum.

20. The processing system of claim 16, wherein said processing system is a plasma etching system receiving a halogen-containing gas as an etching gas.

* * * * *